(12) United States Patent
Ha et al.

(10) Patent No.: US 6,596,605 B2
(45) Date of Patent: Jul. 22, 2003

(54) METHOD OF FORMING GERMANIUM DOPED POLYCRYSTALLINE SILICON GATE OF MOS TRANSISTOR AND METHOD OF FORMING CMOS TRANSISTOR DEVICE USING THE SAME

(75) Inventors: Jung-Min Ha, Seoul (KR); Jung-Woo Park, Seoul (KR)

(73) Assignee: Samsung Electronics Co., Ltd. (KR)

( * ) Notice: Subject to any disclaimer, the term of this patent is extended or adjusted under 35 U.S.C. 154(b) by 4 days.

(21) Appl. No.: 09/750,943

(22) Filed: Dec. 28, 2000

(65) Prior Publication Data

US 2002/0072182 A1 Jun. 13, 2002

(30) Foreign Application Priority Data

Dec. 12, 2000 (KR) ........................................ 2000-75643

(51) Int. Cl.[7] .............................................. H01L 21/76
(52) U.S. Cl. ....................................... 438/417; 438/933
(58) Field of Search ................................ 438/199, 752, 438/933, 417, 301

(56) References Cited

U.S. PATENT DOCUMENTS 5,763,319 A * 6/1998 Ling et al. .................. 438/514
6,090,690 A * 7/2000 Moslehi ...................... 438/513
6,252,283 B1 * 6/2001 Gardner et al. ............. 257/351
6,313,505 B2 * 11/2001 Yu .............................. 257/336
6,373,112 B1 * 4/2002 Murthy et al. .............. 257/407

OTHER PUBLICATIONS

Wen–Chin Lee, et al., IEEE Electronic Device Letters, vol. 19 No. 7, Jul. 1998.

* cited by examiner

Primary Examiner—William David Coleman
(74) Attorney, Agent, or Firm—Mills & Onello LLP

(57) ABSTRACT

A method of forming polycrystalline silicon germanium gate electrode is disclosed. The method include the steps of forming gate insulation layer on a substrate, forming a polycrystalline silicon layer on the gate insulation layer and making a plasma doping of germanium to the polycrystalline silicon layer. Generally, boron is doped to the polycrystalline silicon after the step of the plasma doping of germanium. The process of plasma doping of germanium comprises the step of forming germanium contained plasma and enhancing bias electric potential to substrate for the formulated germanium plasma to be accelerated and injected to the polycrystalline silicon layer revealed. If the present invention is applied to CMOS transistor device, doping mask for the germanium plasma doping can be used.

18 Claims, 7 Drawing Sheets

METHOD OF FORMING GERMANIUM DOPED POLYCRYSTALLINE SILICON GATE OF MOS TRANSISTOR AND METHOD OF FORMING CMOS TRANSISTOR DEVICE USING THE SAME

This application relies for priority upon Korean Patent Application No. 2000-75643, filed on Dec. 12, 2000, the contents of which are herein incorporated by reference in their entirety.

FIELD OF THE INVENTION

The present invention is related to method of forming semiconductor devices and, more particularly, to method of forming gate electrode of MOS transistor made of polycrystalline silicon-germanium and method of forming CMOS transistor device using the same.

BACKGROUND OF THE INVENTION

PMOS transistors can be used having no relation to NMOS transistor in a semiconductor device. But, usually, PMOS transistors are used with NMOS transistor in CMOS type semiconductor devices. In a CMOS type semiconductor device, PMOS transistors and NMOS transistors are connected with each other and work together complementarily. Resultantly, the operation speed and efficiency of device can be improved and CMOS transistor has characteristics similar to those of bipolar type transistor. Therefore, the CMOS type semiconductor device is mainly used in high speed and quality devices.

As the size of elements becomes smaller to increase the integration level and operation speed and to improve voltage characteristic, dual gate type CMOS type devices are more frequently used among the CMOS type devices. In dual gate type devices, polycrystalline silicon forming gate electrode is doped with an impurity same as the source/drain region.

In the process of fabricating a high quality dual gate type CMOS transistor, as an impurity of gate electrode in PMOS transistor, Boron is generally used. And when ion implantation for source/drain region of PMOS transistor is executed, P type impurities such as Boron are also implanted into the polycrystalline silicon gate electrode.

However, Boron may cause gate depletion. The gate depletion means that the decrease in effective concentration of boron in polycrystalline gate electrode caused when the boron doping or activation of doped boron is not enough or when boron elements are diffused to gate insulation layer or to channel region beyond the gate. The diffused boron elements in channel or in gate insulation layer deteriorate the character of channel and gate insulation layer. And, the gate depletion lowers conductivity of gate and increases the effective thickness of gate insulation layer causing problems such as decrease in drain current.

Thus, when boron is used as an impurity of polycrystalline silicon gate, a method of preventing the gate depletion is needed. As the preventing method, a method of doping germanium to polycrystalline silicon gate electrode is well known to those who are skilled in the art. If germanium elements are added to polycrystalline silicon, solubility of the polycrystalline silicon to boron is increased to reduce an amount of diffused boron beyond the gate electrode through an annealing step.

FIG. 1 is a graph showing the change of resistance of polycrystalline silicon gate according to the change of concentration of germanium therein and the change of the amount of boron dose implanted therein. The measure of the resistance is made after the substrate is annealed for 30 seconds at the temperature of 600 Celsius degree. According to FIG. 1, at the same degree of boron dose, the resistance of polycrystalline silicon gate decreases as the concentration of germanium in polycrystalline silicon gate increase. And, at the same degree of boron dose, it is known that as the germanium concentration increases, the capacitance of gate also increases. (Investigation of Poly SiGe for dual gate CMOS technology, Wen-Chin Lee et. al., IEEE Electronic Device Letters, vol. 19, No. 7, July 1998)

A common method of doping germanium to gate electrode made of polycrystalline silicon is to supply germanium-contained gas as one of source gases in the process of depositing polycrystalline silicon layer. One more common method of doping germanium is to implant germanium into polycrystalline silicon layer ready made.

In case of supplying the germanium-contained gas, generally, GeH4 gas mixed with silane gas (SiH4) is supplied to the CVD process chamber during some time in the process of forming gate layer and thus silicon-germanium layer in the gate layer is made by in-situ type procedure. In this case, silicon germanium layer which contains 20~30 weight % of germanium and has better solubility compared with pure polycrystalline silicon can easily be acquired. But, in this method, controlling the process is so difficult that it is hard to secure uniformity and reliability of germanium concentration. Especially, for CMOS devices, as the CVD process is performed at high temperature that photoresist masking is unusable, the silicon germanium layer should be formed in the gate electrode of NMOS transistor as well as in the gate electrode of PMOS transistor. However, germanium, for example, germanium of 10% or more in the gate electrode of NMOS transistor lowers the solubility of polycrystalline silicon gate to N type impurities and lowers the capacitance of gate. This causes the degradation of transistor in CMOS devices.

In case of ion implantation method, by forming pure polycrystalline silicon gate layer and by forming photoresist pattern which covers NMOS region, boron ion (BF2+ or B+) can be doped only to polycrystalline silicon layer of PMOS transistor region. But, to obtain germanium of 20~30 weight % in polycrystalline silicon germanium gate, an amount of 1E16 ions/square centimeter or more dose corresponding to ion implantation continued for 10 or more hours are needed, which means the process does not have actual productivity.

Thus, a method of doping such a degree of germanium ion dose in a short duration, for example 1 hour, with exactness is needed.

SUMMARY OF THE INVENTION

It is therefore one feature of the present invention to solve the above mentioned problem of prior method of doping germanium in polycrystalline silicon gate layer.

Thus, it is an object of the present invention to provide a method of forming polycrystalline silicon germanium gate electrode by which a considerable amount of germanium can be doped effectively and to provide a method of forming CMOS transistor by using the same.

It is another object of the present invention to provide a method of forming polycrystalline silicon germanium gate electrode by which the doping concentration of germanium can be controlled with exactness and to provide a method of forming CMOS transistor by using the same.

It is also one object of the present invention to provide a method of forming CMOS transistor by which boron concentration can be sustained enough only in polycrystalline silicon gate electrode of PMOS transistor region.

For those purposes, the present invention propose a method of forming polycrystalline silicon germanium gate electrode including the steps of forming a gate insulation layer on a substrate, forming a polycrystalline silicon layer on the gate insulation layer and making a plasma doping of germanium to the polycrystalline silicon layer.

Generally, a step of boron doping to the polycrystalline silicon is made after the step of plasma doping of germanium. Here, the boron doping can be made by ion implantation or by the method of plasma doping.

In the present invention, the process of plasma doping of germanium may have the following steps: making a germanium containing plasma by supplying germanium source to a process chamber which has plasma enhancing devices, enhancing bias electric potential to the substrate for the formed germanium plasma to be accelerated to the substrate and to be injected into the substrate, more strictly to polycrystalline silicon layer revealed.

As a germanium source, GeH4, germanium halide like GeF4, solid germanium can be used. The concentration of germanium in the gate layer can be controlled by the amount and concentration of supplied germanium source gas and by controlling the time duration of the gas supply. The energy of germanium plasma injection can be controlled by the bias electric potential. But, generally, depth of the injection is confined to shallow region and thus the energy level control does not have significant meaning.

In the plasma doping of the present invention, because only the germanium source is supplied, the total amount of supply and the concentration of germanium in the gate can be more stably controlled compared to CVD doping method in which the germanium source gas mixed with SiH4 gas is supplied. And, because the germanium source is supplied directly to the process chamber to form germanium plasma and the germanium plasma is directly accelerated to substrate, doping with high dose ranging from 1E16 to 1E17 ions/square centimeter and forming of polycrystalline silicon germanium layer of over 10% germanium concentration can be executed in a practical process.

In the process of making CMOS device, forming of a doping mask pattern which covers the NMOS transistor region before doping germanium plasma makes the plasma doping of germanium be confined within the PMOS transistor region where boron is to be doped.

The plasma doping of germanium is generally made to the surface of the polycrystalline silicon layer revealed. Thus, to prevent gate depletion effectively, it is needed to increase the concentration of germanium of the gate electrode near the gate insulation layer. To increase the concentration of germanium, the polycrystalline silicon layer for gate electrode may be deposited in two or more separated deposition steps and the plasma doping of germanium may be made between the deposition steps.

The present invention also propose a method of forming a CMOS transistor device including the steps of forming gate insulation layer on a substrate, forming a polycrystalline silicon layer on the gate insulation layer and making a plasma doping of germanium to the polycrystalline silicon layer only in the region of PMOS transistor.

Generally, forming an element isolation layer is made ahead of forming the gate insulation layer. And, step of patterning the polycrystalline silicon layer to make gate patterns is needed.

To make plasma doping of germanium only to the PMOS transistor region, a step of forming a plasma doping mask covering the NMOS transistor region is needed. Similarly, to dope a type of impurity to source/drain region of N type or P type transistor, steps of forming a impurity doping mask are also needed.

BRIEF DESCRIPTION OF DRAWINGS

The other objects, features and advantages of the present invention will become apparent form the following description taken in conjunction with the accompanying drawings, in which.

DETAILED DESCRIPTION OF THE PREFERRED EMBODIMENT

The preferred embodiment of the invention will now be described more fully hereinafter with reference to accompanying drawings.

Embodiment 1

In this embodiment, CMOS transistor is explained and PMOS transistor part and NMOS transistor part of the CMOS transistor are individually explained in some step of the present invention.

Figure 1:
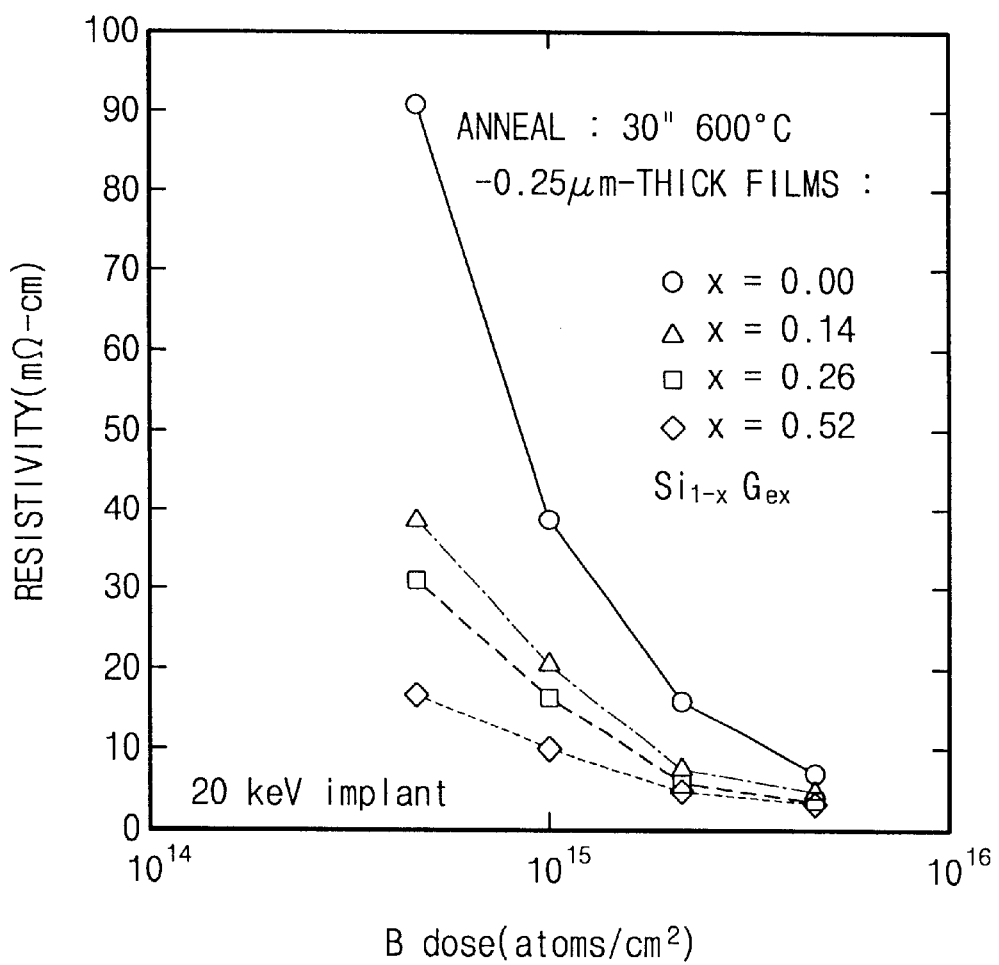
FIG. 1 shows the change of resistance of polycrystalline silicon gate according to the change of concentration of germanium in it and to the change of the amount of boron dose implanted in it when the measure of the resistance is made after the substrate is annealed during 30 seconds at the temperature of 600 Celsius degree.
Figure 2:
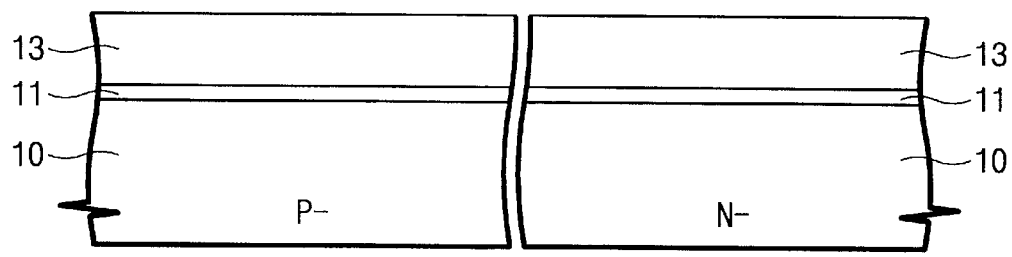
FIG. 2 through FIG. 6 show cross sectional views of PMOS transistor region and NMOS transistor region in CMOS transistor device at some process steps of one embodiment of the present invention.

Referring to FIG. 2, a gate insulation layer 11 made of silicon oxide is formed on the substrate 10 by oxidizing the surface silicon of the substrate 10. A pure polycrystalline silicon layer 13 of 1000~2000 angstroms is formed on the gate insulation layer 11 by CVD (Chemical Vapor Deposition). Before forming a gate insulation layer, although not shown, an N type substrate having P well is supplied and device isolation is performed in the substrate.

Figure 3:
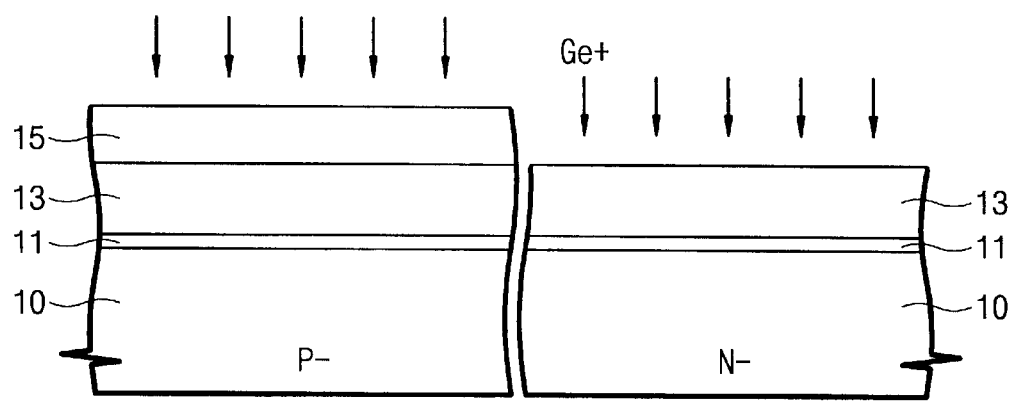

Referring to FIG. 3, doping mask 15 to cover NMOS transistor region is formed with photoresist by general photolithography process. Then, germanium plasma is made by supplying germanium-contained source gas into process chamber supplied with plasma enhancing apparatus. For this process of making germanium plasma, the atmospheric pressure in the chamber is at a range of 10 to 200 mTorr and the temperature in the chamber lies below 200 Celsius degree, more favorably lies below 100 Celsius degree not to cause photoresist burning. And, to the substrate 10 in the chamber, negative electric potential of 1 to 30 kV is applied to accelerate the germanium plasma toward the substrate 10 and to inject the germanium-contained ions into the polycrystalline silicon layer 13 in the revealed PMOS transistor region. In the process chamber, the germanium plasma can be made by supplying germanium source gas such as GeH4 and enhancing electric field varying with radio frequency to the source gas. By controlling the amount of the supplied source gas and process time, dose of 1E15 to 1E17 ions/square centimeter is doped to form a polycrystalline silicon germanium layer having a concentration of 20 weight % or to form a polycrystalline silicon germanium layer of decades or hundreds of angstroms on a top of the polycrystalline silicon layer 13.

Figure 4:
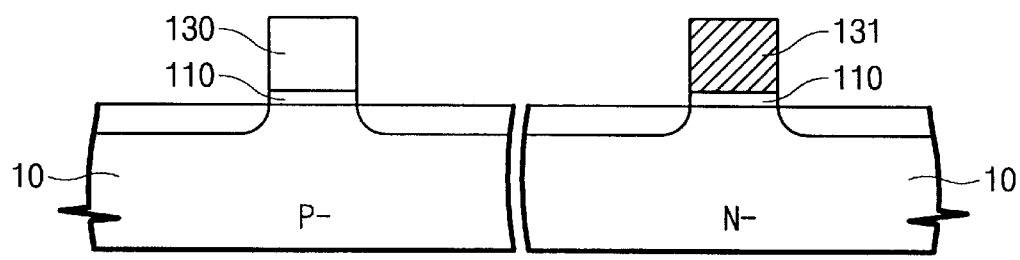

Referring to FIG. 4, plasma doping mask is removed and gate patterns 130 and 131 and gate insulation patterns 110 are formed over an entire surface of the substrate 10 by patterning the polycrystalline silicon layer. Here, the patterning is performed using a conventional photolithography and etching process. Thus, pure polycrystalline silicon gate patterns 130 are formed in the NMOS transistor region and polycrystalline silicon germanium gate patterns 131, so to speak, polycrystalline silicon gate patterns containing germanium are formed in the PMOS transistor region.

Figure 5:
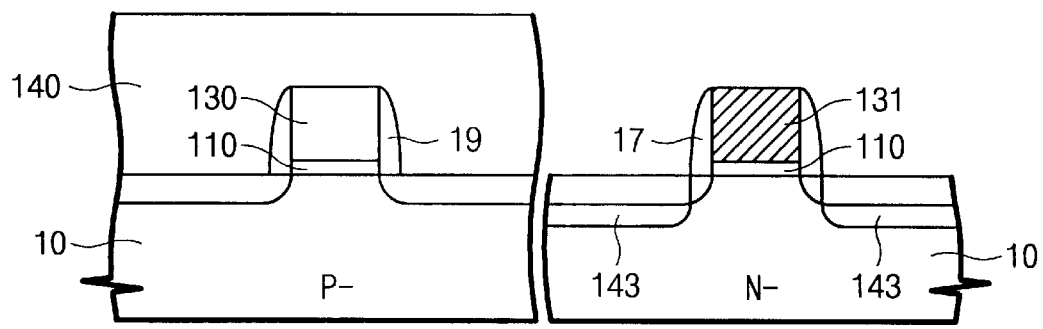

And then, as shown in FIG. 4, doping low dose impurity is performed using the gate patterns 130 and 131 as ion implanting mask in the shallow part of source/drain region of each transistor to form LDD (Lightly Doped Drain) structure Referring to FIG. 5, sidewall spacers 17 and 19 are formed on the sidewalls of gate patterns 130 and 131, respectively. Then, ion implantation mask 140 to cover the NMOS transistor region is formed on the substrate 10 having gate patterns 130 and 131 using a conventional photolithography process and deep implantation of boron ion to PMOS transistor region is carried out to form a deeply doped source/drain region 143.

Figure 6:
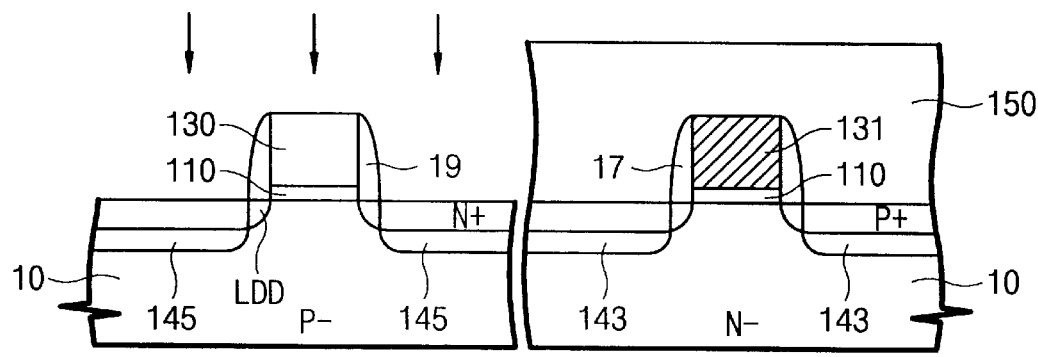

Referring to FIG. 6, the ion implantation mask to cover the NMOS transistor region is removed. Then, other ion implantation mask 150 to cover the PMOS transistor region is formed on the substrate 10 having gate patterns 130 and 131 using a conventional photolithography process and high dose, deep implantation of N type impurity ion containing phosphor or arsenic element to NMOS transistor region is carried out to form a deeply doped source/drain region 145.

After the high dose and high energy implantations, the whole structure of source/drain including LDD region is formed. And then, the following step (e.g., annealing or forming an interlayer insulation layer) to form a CMOS transistor device will be carried out.

Embodiment 2

Figure 7:
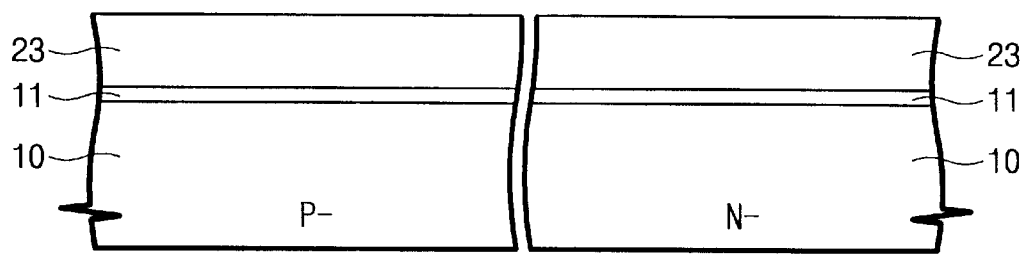
FIG. 7 through FIG. 12 show cross sectional views of PMOS transistor region and NMOS transistor region in CMOS transistor device at some process steps of another embodiment of the present invention.

Referring to FIG. 7, a gate insulation layer 11 made of silicon oxide is formed on the substrate 10 by oxidizing the surface silicon of the substrate 10. A pure polycrystalline silicon layer 23 of 200~1000 angstroms is formed on the gate insulation layer 11 by CVD (Chemical Vapor Deposition). Before forming gate insulation layer, an N type substrate having P well is supplied and device isolation is performed in the substrate.

Figure 8:
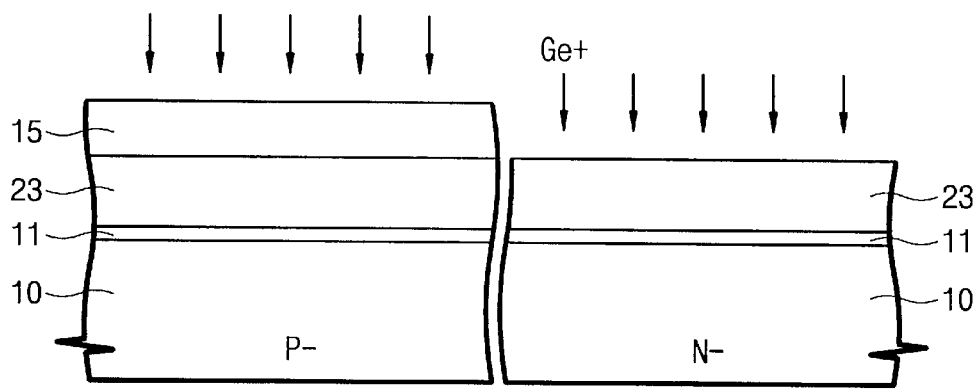

Referring to FIG. 8, doping mask 15 to cover NMOS transistor region is formed with photoresist layer by general photolithography process. Then, germanium plasma is made by supplying germanium-contained source gas into process chamber and enhancing electric field varying with radio frequency.

Conditions and arrays of procedure adapted in Embodiment 1 can also be applied to this embodiment. And resultantly, dose of 1E15 to 1E17 ions/square centimeter is doped to form several ten angstroms or several hundred angstroms of polycrystalline silicon germanium layer in which the germanium concentration of 20 weight % in the upper part of polycrystalline silicon layer 23.

Figure 9:
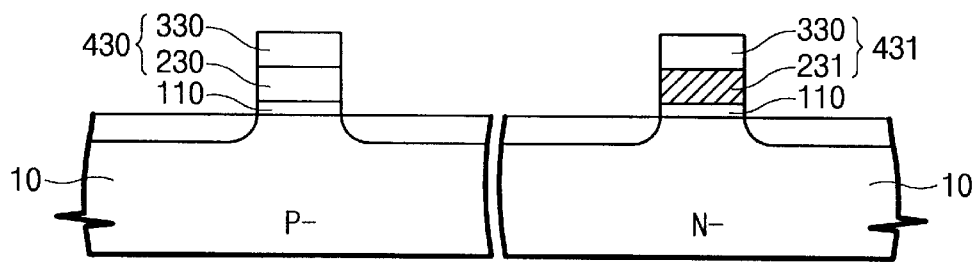

Referring to FIG. 9, plasma doping mask is removed and additional polycrystalline layer of thickness of 500 to 1500 angstroms is formed by CVD process. Then, gate patterns 430 and 431 including additional polycrystalline silicon layer pattern 330 and polycrystalline silicon layer pattern 230 or polycrystalline silicon germanium layer pattern 231, and gate insulation patterns 110 are formed over an entire surface of substrate by patterning the polycrystalline silicon layer and the additional polycrystalline silicon layer. Thus, pure polycrystalline silicon gate pattern 430 is formed in the NMOS transistor region and polycrystalline silicon germanium gate pattern 431, so to speak, polycrystalline silicon gate patterns containing germanium are formed in the PMOS transistor region.

And then, as shown in FIG. 9, doping a low dose impurity is performed in the shallow part of source/drain region of each transistor to form LDD (Lightly Doped Drain) structure in the substrate 10.

Figure 10:
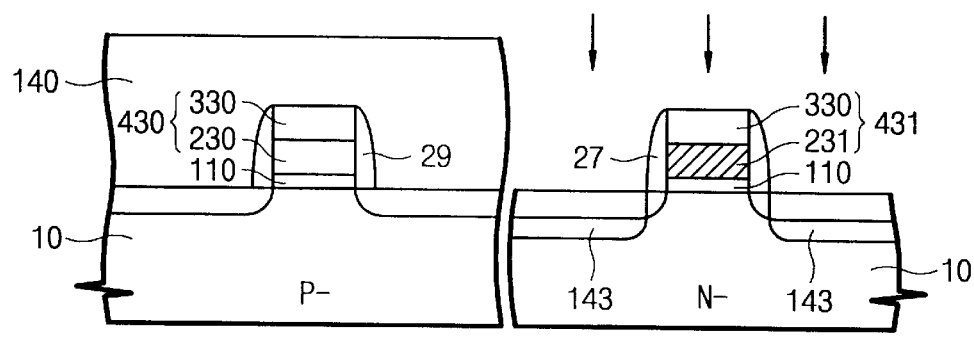

Referring to FIG. 10, sidewall spacers 27 and 29 are formed on the sidewalls of gate patterns 430 and 431, respectively. Then, ion implantation mask 140 to cover the NMOS transistor region is formed on the substrate 10 and high dose deep implantation of boron ion to PMOS transistor region carried out to form a deeply doped source/drain region 143.

Figure 11:
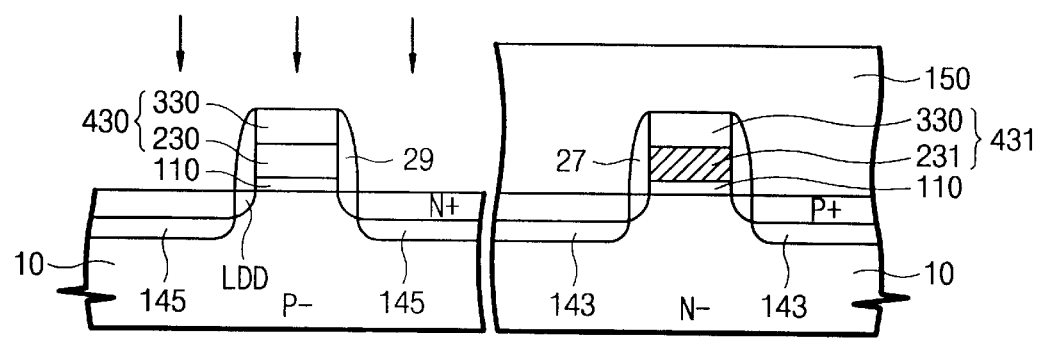

Referring to FIG. 11, the ion implantation mask to cover the NMOS transistor region is removed. Then, other ion implantation mask 150 to cover the PMOS transistor region is formed on the substrate 10, and high dose and high energy implantation of N type impurity ion to NMOS transistor region is carried to form a deeply doped source/drain region 145.

After the high dose and high energy implantations, the whole structure of source/drain including LDD region is formed.

Figure 12:
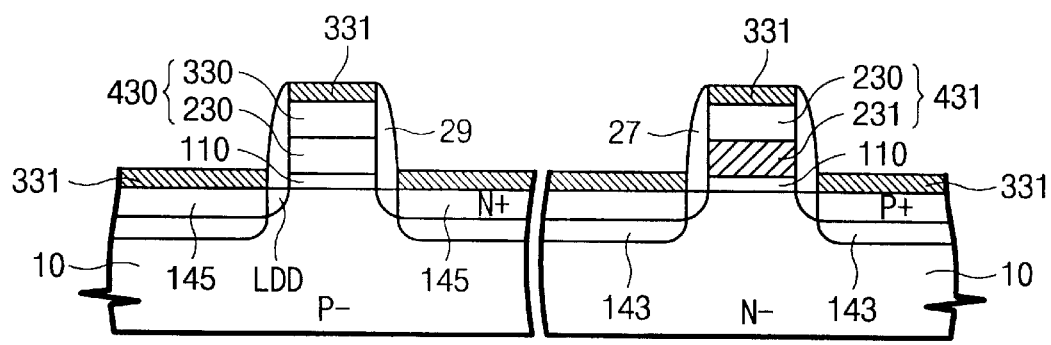

Referring to FIG. 12, on the substrate 10 having CMOS transistor structure, metal layer of titanium or cobalt is formed by PVD (physical vapor deposition: sputtering) and annealing is carried out to form a metal silicide layer 331 on gate patterns 430 and 431 and on source/drain region 143 and 145 where the silicon material is revealed. Then, etching process for removing metal which does not experience silicidation is performed. A metal silicide layer at the surface of gate patterns may be thicker than that at the surface of source/drain region. In the annealing step for silicidation, the activation of impurity in gate electrodes can also be performed. And, the following steps (e.g., forming an interlayer insulating layer) to form a CMOS transistor device will be performed.

According to the present invention, considerable amount of germanium can be doped effectively and the doping concentration of germanium in polycrystalline silicon gate electrode can be controlled with high reliability in the process of forming PMOS transistor. And, boron concentration can be sustained enough only in polycrystalline silicon gate electrode of PMOS transistor region in the process of forming CMOS transistor device.

What is claimed is:

1. A method of forming polycrystalline silicon gate of MOS transistor comprising the steps of:

forming a gate insulation layer on a substrate;

forming a polycrystalline silicon gate layer on the gate insulation layer; and doping the polycrystalline silicon gate layer with a germanium plasma without doping source/drain regions of the MOS transistor.

2. The method of claim 1 further comprising a step of doping boron to the polycrystalline silicon gate layer doped with germanium.

3. The method of claim 2 wherein the boron is doped by ion implantation.

4. The method of claim 1 wherein the step of germanium plasma doping comprises the steps of:
   making germanium-contained plasma by supplying germanium source to a process chamber having a plasma enhancing apparatus; and
   enhancing bias electric potential to the substrate for the germanium plasma to be accelerated toward the substrate and to be injected into the polycrystalline silicon gate layer.

5. The method of claim 4 wherein the bias electric potential has a negative value and an absolute value between 1 keV and 30 keV.

6. The method of claim 1 further comprising a step of forming an additional polycrystalline silicon layer after the step of the germanium plasma doping.

7. The method of claim 6 wherein a thickness of the polycrystalline silicon gate layer lies between 200 angstrom and 1000 angstroms and that of the additional polycrystalline silicon layer lies between 500 angstroms and 1500 angstroms.

8. The method of claim 1 wherein the germanium plasma doping is made with a dose amount of 1E16~1E17 ions/square centimeter to form a polycrystalline silicon germanium layer containing germanium of 10 weight percent or more on a top of the polycrystalline silicon layer.

9. The method of claim 1 wherein a source of the germanium plasma doping is one selected from the group of GeH4, germanium halide and solid germanium.

10. The method of claim 1 wherein the germanium plasma doping is performed under condition that the atmospheric pressure lies between 10 and 200 mTorr and the temperature lies below 200 Celsius degree.

11. A method of making a CMOS transistor device comprising the steps of:
   forming gate insulation layer on a substrate;
   forming a polycrystalline silicon gate layer on the gate insulation layer;
   forming a plasma doping mask covering the NMOS transistor region;
   doping the polycrystalline silicon gate layer with germanium plasma using the plasma doping mask without doping source/drain regions of the NMOS transistor region;
   patterning the polycrystalline silicon gate layer to form gate patterns;
   doping a P type impurity to a source/drain region of a PMOS transistor; and
   doping an N type impurity to a source/drain region of an NMOS transistor.

12. The method of claim 11 further comprising the steps of removing the plasma doping mask and forming an additional silicon layer after the step of germanium plasma doping.

13. The method of claim 12 wherein the additional silicon layer is a polycrystalline silicon layer.

14. The method of claim 11 wherein the step of doping the P type impurity includes the steps of:
   forming P type impurity doping mask covering the NMOS transistor region; and
   performing an ion implantation of P type impurity to the polycrystalline silicon gate layer containing germanium using the P type impurity doping mask.

15. The method of claim 14 further comprising the steps of:
   removing the P type impurity doping mask;
   forming a metal layer on the substrate after removing the P type impurity doping mask; and
   performing an annealing to form a metal silicide layer on a revealed silicon region, and removing residual metal which does not experience silicidation.

16. The method of claim 14 wherein the P type impurity is one selected from the group consisting of boron and boron-contained chemicals.

17. The method of claim 11 further comprising the steps of:
   implanting low dose impurity ion into each impurity type of transistor region to form an LDD (lightly doped drain) adjacent to the gate patterns; and
   forming a gate spacer on the gate patterns after the step of patterning the polycrystalline silicon gate layer.

18. The method of claim 11 wherein the step of doping the N type impurity doping is ahead of the step of doping the P type impurity.

* * * * *